(12) United States Patent
Degroot et al.

(10) Patent No.: US 9,065,008 B2
(45) Date of Patent: Jun. 23, 2015

(54) AUTOMATED ASSEMBLY METHOD FOR THE PRODUCTION OF INTERCONNECTED THIN FILM SOLAR CELL MODULES

(75) Inventors: Marty W. Degroot, Midland, MI (US);
Narayan Ramesh, Midland, MI (US);
Minoru Sakuma, Midland, MI (US);
Dustin M. Charamut, Mesa, AZ (US);
Michael E. Mills, Midland, MI (US);
David J. Perkon, Mesa, AZ (US)

(73) Assignee: Dow Global Technologies LLC, Midland, MI (US)

( * ) Notice: Subject to any disclaimer, the term of this patent is extended or adjusted under 35 U.S.C. 154(b) by 125 days.

(21) Appl. No.: 13/810,356

(22) PCT Filed: Jul. 29, 2011

(86) PCT No.: PCT/US2011/045822
§ 371 (c)(1),
(2), (4) Date: Jan. 15, 2013

(87) PCT Pub. No.: WO2012/016103
PCT Pub. Date: Feb. 2, 2012

(65) Prior Publication Data
US 2013/0122639 A1   May 16, 2013

Related U.S. Application Data

(60) Provisional application No. 61/369,257, filed on Jul. 30, 2010.

(51) Int. Cl.
*H01L 31/18* (2006.01)

(52) U.S. Cl.
CPC .......... *H01L 31/1876* (2013.01); *H01L 31/188* (2013.01); *Y02E 10/50* (2013.01)

(58) Field of Classification Search
CPC ....... Y02E 10/50; H01L 31/05; H01L 31/516; H01L 31/48; H01L 31/188
USPC .................................................... 438/57, 80
See application file for complete search history.

(56) References Cited

U.S. PATENT DOCUMENTS

| 6,841,728 B2 * | 1/2005 | Jones et al. ............... 136/244 |
| 6,927,850 B1 * | 8/2005 | Snail et al. ............... 356/244 |

(Continued)

FOREIGN PATENT DOCUMENTS

| DE | 10 2008 047517 | 3/2010 |
| EP | 1 883 117 | 1/2008 |

(Continued)

Primary Examiner — Savitr Mulpuri
(74) Attorney, Agent, or Firm — Kagan Binder, PLLC (57) ABSTRACT

A method of manufacturing electrically interconnected solar cell assemblies, including the steps of: positioning at least a first interconnect element (64) in an alignment feature of a top carrier and facing a top surface of a first photovoltaic cell (60); adhering the first interconnect element to a location on the top surface of the first cell, wherein a length of the first interconnect element extends beyond a trailing edge (68) of the first cell; and adhering a portion of the length of the first interconnect element that extends beyond a trailing edge of the first cell to the bottom surface of a second cell (62). In one aspect, a system is provided for assembling solar cell strings, including cell transfer equipment, a bottom pallet including grooves, multiple top pallets including grooves, an adhesive dispensing system, a ribbon supply mechanism, and a system for moving ribbons and top pallets.

17 Claims, 5 Drawing Sheets

(56) References Cited

U.S. PATENT DOCUMENTS

| | | | |
|---|---|---|---|
| 7,908,743 B2 * | 3/2011 | Li et al. | 29/830 |
| 8,065,784 B2 * | 11/2011 | Lu et al. | 29/564 |
| 8,163,089 B2 * | 4/2012 | Rathweg et al. | 118/715 |
| 8,247,681 B2 | 8/2012 | Reinisch | |
| 8,309,840 B2 * | 11/2012 | Stevens et al. | 136/251 |
| 8,748,733 B2 * | 6/2014 | Leary | 136/251 |
| 8,759,664 B2 * | 6/2014 | Kanto et al. | 136/244 |
| 8,884,155 B2 * | 11/2014 | Luch et al. | 136/244 |
| 2009/0056784 A1 | 3/2009 | Reinisch | |
| 2010/0043863 A1 * | 2/2010 | Wudu et al. | 136/244 |
| 2010/0275969 A1 * | 11/2010 | Chan et al. | 136/244 |
| 2010/0294339 A1 * | 11/2010 | Hollars | 136/247 |
| 2011/0253188 A1 * | 10/2011 | Lenox | 136/244 |

FOREIGN PATENT DOCUMENTS

| | | |
|---|---|---|
| EP | 1 973 173 | 9/2008 |
| JP | 2006 120998 | 5/2006 |
| WO | WO 2004/038814 | 5/2004 |

\* cited by examiner

AUTOMATED ASSEMBLY METHOD FOR THE PRODUCTION OF INTERCONNECTED THIN FILM SOLAR CELL MODULES

PRIORITY

The present application claims priority to International Application No. PCT/US2011/045822, filed on Jul. 29, 2011, which in turn claims priority under 35 U.S.C. §119(e) from the U.S. Provisional patent application having Ser. No. 61/369,257, filed on Jul. 30, 2010, by Degroot et al. and titled AUTOMATED ASSEMBLY METHOD FOR THE PRODUCTION OF INTERCONNECTED THIN FILM SOLAR CELL MODULES, wherein the entirety of said patent applications are incorporated herein by reference.

TECHNICAL FIELD

The present invention relates generally to thin film solar cells used for converting sunlight into electrical power, and more particularly relates to methods and equipment for interconnecting solar cells to form a photovoltaic module or string.

BACKGROUND

The field of photovoltaics generally relates to multi-layer materials that convert solar radiation or sunlight energy into direct current (DC) electricity for the generation of electric power. These photovoltaic materials are commonly referred to as solar cells, and can be produced commercially in a thin-film configuration, such as by depositing one or more thin layers of photovoltaic material and supporting layers onto a substrate in a certain pattern and sequence. Thin film solar cells provide several advantages. One such advantage is that these compositions have a high cross-section for absorbing incident light. That is, photovoltaic layers that are very thin can capture a relatively high percentage of incident light. For example, in many thin film solar cell devices, photovoltaic layers may have a thickness in the range of from about 1 µm to about 4 µm. These thin layers allow devices incorporating these layers to be flexible. The characteristic flexibility of thin films further enables the solar cell material comprising numerous devices to be prepared in a continuous fashion, such as on a flexible web. This is in contrast to less flexible solar cells, such as those that comprise crystalline silicon, for example, which are typically fabricated and processed as discrete individual solar cells.

Because a single conventional solar cell typically cannot generate enough electricity for most applications, a number of solar cells can be electrically and physically connected to each other in an arrangement that is referred to as a photovoltaic module or "string". Such modules or strings are designed to supply electricity at a certain voltage, where the electricity produced is directly proportional to the amount of sunlight that strikes the module. Multiple modules can in turn be attached to each other to form an array. In general, the larger the area of a module or array, the more electricity that will be produced. These modules and arrays can be connected in either series or parallel electrical arrangements to produce desired voltage and current combinations. In particular, electrical connections can be made in series to achieve a desired output voltage and/or in parallel to provide a desired amount of current source capability. In addition, a semiconductor junction develops a photo-voltage, while the area and other parameters of the device determine the available current. Commercially available solar panels are therefore designed to have an appropriate area and arrangement to deliver a certain amount of power and optimize other application parameters.

Photovoltaic arrays are often associated with buildings, where these arrays can be integrated into the building structure, mounted onto the building in some way (e.g., attached to the roof structure), or located separately from the building structure but connected by a cable or power supply to the building. In some cases, arrays are built as a part of the construction of a new building, and in other cases, the arrays are retrofitted into existing buildings. For one example, roof tiles have been developed that incorporate photovoltaic cells, where these tiles are used instead of traditional roofing shingles. In another application, solar cells can be incorporated into wall panels of a building, such as panels that can be incorporated into the siding structure or that may be attached to existing siding materials. Such roof tiles and/or wall panels can be incorporated into both domestic and industrial buildings as a primary or secondary source of electrical power for that structure.

As part of the process of fabricating thin film solar cell modules or strings, several processing steps must be carried out to connect multiple solar cells to each other, which can be referred to as an interconnection process. Such an interconnection process requires precise placement of interconnecting elements, which can be wires or flat wires (which are also referred to herein and known in the art as ribbons), for example, and solar cells in order to obtain mechanically robust solar cell strings that can be used in later processes that utilize those strings. This precise placement of wire ribbons relative to the solar cells also requires precise regulation of the dispensing of the conductive epoxy that functions as an adhesive. Precise control of mechanical tolerances is important to ensuring that the solar cell strings can easily be accommodated in downstream processes. Ensuring high accuracy and precision in processes for interconnecting thin film solar cells can be challenging operations compared to similar processes for rigid substrates, particularly due to the additional degrees of freedom that are afforded by the flexible nature of the thin film solar cell. Thus, there is a need to provide automated thin film solar cell interconnection equipment and methods for electrically connecting multiple solar cells in an efficient and accurate manner.

BRIEF DESCRIPTION OF THE DRAWINGS

The present invention will be further explained with reference to the appended Figures, wherein like structure is referred to by like numerals throughout the several views, and wherein.

SUMMARY

The present invention relates to the fabrication of interconnected solar cell assemblies using a "string and tab" type of approach, which requires precise placement of interconnecting ribbons and solar cells in a predefined configuration. In order to accomplish this, systems and methods of the invention are provided for an automated solar cell string manufacturing system that utilizes a thermally stabilized adhesive curing carrier assembly (e.g., a conveyer or more preferably a pallet assembly) structure and that provides the ability to repeatedly manufacture thin film solar cell interconnected strings with a desired degree of accuracy. The interconnect equipment generally includes a bottom carrier (e.g., conveyor belt or roll or other element but preferably a pallet), at least one top carrier (preferably multiple top pallets), a robot for transferring top carriers (e.g., pallets), a transporting system (preferably a conveyor system for transporting pallet assemblies through an adhesive curing and/or heating system), an adhesive dispensing system, a ribbon (e.g., a wire ribbon) feeding system, one or more vision systems, and a cell placement system for placing cells on the bottom carrier (e.g., bottom pallet), although all of these components are not necessary for every system. The physical features of the carriers (e.g., pallets), including the use of interfacing mechanical engagement and alignment features for securing the pallets and alignment features such as pins or grooves for securing the ribbons and adhesive, are advantageous to provide for precise control of the mechanical tolerances of the interconnected solar cell assemblies. Such pins or grooves can provide for interfacing mechanical engagement and/or alignment features and adhesive curing for the solar cell assemblies. Thus, the manufacturing system of the invention can be referred to generally as a pallet-based photovoltaic string assembly system.

In accordance with one aspect of the invention, a method of manufacturing electrically interconnected solar cell assemblies is provided, comprising the steps of: (a) providing a first photovoltaic cell; (b) positioning at least a first interconnect element in an alignment feature (e.g., a groove) of a top carrier (e.g., pallet) and facing a top surface of the first cell; (c) adhering the first interconnect element to a predetermined location on the top surface of the first cell, wherein a length of the first interconnect element extends beyond a trailing edge of the first cell; (d) positioning a portion of the length of the first interconnect element that extends beyond the trailing edge of the first cell in a first alignment feature (e.g., groove) of a bottom carrier (e.g., pallet); and (e) adhering at least a portion of the length of the first interconnect element that is positioned in the first alignment feature of the bottom carrier to a predetermined location on the bottom surface of a second cell, thereby creating a string of multiple photovoltaic cells. Step (c) may further include applying adhesive on at least one of a predetermined location on the top surface of the first cell and a predetermined location on a surface of the first interconnect element, and step (e) can further comprise applying adhesive on at least one of a predetermined location on a bottom surface of the second cell and a portion of the length of the first interconnect element that is positioned in the first alignment feature of the bottom carrier.

The above steps provide for interconnection of adjacent pairs of cells; however, a solar cell module or string will often also desirably be provided with a leading ribbon and/or a trailing ribbon to provide for electrical connection of the module or string with other conductive elements within the module such as terminal bars and buss bars in order to utilize the solar power collected by the solar cell assembly. In cases where a trailing ribbon is desired, the method can further comprise the steps of: positioning at least one trailing element in an alignment feature (e.g., groove) of a top carrier (e.g., pallet) and facing a top surface of the final cell of the string; and adhering the at least one trailing element to a predetermined location on the top surface of the final cell, wherein a portion of each of the at least one trailing elements extends beyond a trailing edge of the final cell. In cases where a leading ribbon is desired, the method can further include the steps of: positioning at least one leading element in an alignment feature (e.g., a groove) of a bottom carrier (e.g., a pallet) and facing a bottom surface of the first cell; and adhering the at least one leading element to a predetermined location on the bottom surface of the first cell, wherein a portion of each of the at least one leading elements extends beyond a leading edge of the first cell.

In accordance with another aspect of the invention, a method of connecting leading and trailing elements to other conductive elements such as terminal or buss bars is provided, such that the connection occurs while the solar cells and ribbons are secured in place by the carrier assemblies (e.g., pallet assemblies).

In accordance with another aspect of the invention, a system is provided for assembling thin film solar cell interconnected strings. The system comprises cell transfer equipment, a lower carrier (e.g., a pallet) comprising alignment features (e.g., multiple grooves) in its top surface, upper carrier system (e.g., a plurality of upper pallets), each of which comprises a surface or plate having alignment features (e.g., multiple grooves) at one of its surfaces, an adhesive dispensing system, a ribbon supply mechanism, and a system for moving wire ribbons and top carriers (e.g., pallets).

DETAILED DESCRIPTION

Referring now to the Figures and initially to FIGS. 1-4, one embodiment of a pallet-based photovoltaic or solar cell interconnect system 10 is illustrated, which generally includes a ribbon reel handler and unwind module 100, a dispense and cell interconnect module 200, a curing oven module 300, and an interconnect pallet/string conveyor system 400. Although the modules and equipment of the system 10 are generally illustrated as being arranged in a linear configuration, certain components of the equipment modules can operate simultaneously such that solar cells may not be simply moving along a linear path through a system that includes sequential processing steps. That is, multiple operations can be occurring at least partially simultaneously in order to increase the throughput time for constructing and curing each solar cell string.

The rolls of photovoltaic cells may be any photovoltaic cells in a flexible form. Examples include IB-IIIA chalcogenides (e.g., copper indium gallium selenides (CIGS), copper indium sulfide selenides (CISS) and the like), amorphous silicon, cadmium tellurides on flexible substrates, and gallium arsenide cells. The photovoltaic cells can comprise a photovoltaic absorber layer that absorbs light energy embodied in the sunlight rays and then photovoltaically converts this light energy into electric energy. In exemplary embodiments, the absorber layer is preferably a chalcogenide-containing absorber region. The absorber can be a single integral layer or can be formed from one or more layers. The chalcogenide absorber layer can incorporate at least one IB-IIIB-chalcogenide, such as IB-IIIB-selenides, IB-IIIB-sulfides, and IB-IIIB-selenides-sulfides that include at least one of copper, indium, and/or gallium. In many embodiments, these materials can be present in polycrystalline form. Advantageously, these materials can exhibit cross-sections for light absorption that allow the absorber to be very thin and flexible. In exemplary embodiments, an absorber layer may have a thickness in the range from about 1 µm to about 5 µm, and more specifically can be in the range of about 2 µm to about 3 µm. In yet other exemplary embodiments, CIGS materials with photovoltaic properties may be represented by the formula $CuIn_{(1-x)}Ga_xSe_{(2-y)}S_y$, where x is 0 to 1 and y is 0 to 2. The copper indium selenides and copper indium gallium selenides can be used. The absorber layer may be formed by any suitable method using a variety of one or more techniques such as evaporation, sputtering, electrodeposition, spraying, sintering, and the like.

The solar or photovoltaic cells discussed herein generally include a flexible substrate onto which multiple thin layers the photovoltaic materials and other active components have been deposited in a particular manner. The substrate may be formed from a wide range of flexible materials that allow the formation of a continuous photovoltaic element. These include polymers, metals, metal alloys, intermetallic compositions, paper, woven or non-woven fabrics, combinations of these, and the like. In one embodiment, a conductive substrate such as stainless steel is used.

A number of layers may also be included as part of the photovoltaic cell, including a backside electrical contact region, buffer region, and transparent conducting oxide (TCO) layer. Each of these regions can be a single integral layer or can be formed from one or more layers. The electrical contact layer may be formed from a wide range of electrically conductive materials, including one or more of Cu, Mo, Ag, Al, Cr, Ni, Ti, Ta, Nb, W, combinations of these, and the like. Conductive compositions incorporating Mo may be used in an illustrative embodiment. When based upon chalcogenide materials, the cell can be provided with a heterojunction structure in contrast to silicon-based semiconductor cells that have a homojunction structure. A heterojunction may be formed between the absorber region and the TCO layer buffered by a buffer layer. An optional window layer also may be present. Each of these regions can be a single integral layer or can be formed from one or more layers. The buffer layer generally comprises an n-type semiconductor material with a suitable band gap to help form a p-n junction proximal to the interface between the absorber region and the buffer layer. Exemplary buffer layer materials include CdS or ZnS, while exemplary TCO layers can be indium tin oxide or aluminum zinc oxide. Zinc oxide can be used as an optional window layer.

Figures 8, 9:
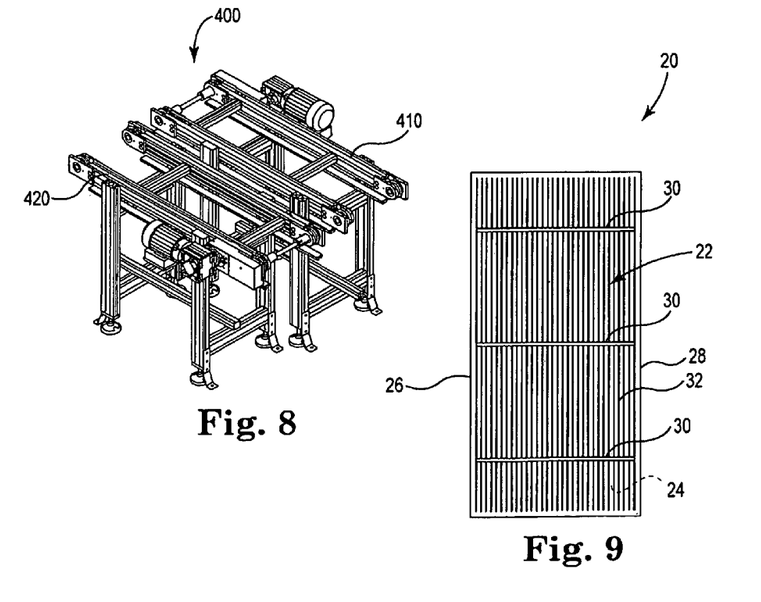
FIG. 8 is a perspective view of an interconnect conveyor system of the interconnect system of FIG. 1.
FIG. 9 is a top view of an individual solar cell of the type that can be interconnected with other solar cells using the methods and systems of the invention.

The thickness of each layer depends on the choice of materials and on the particular application process chosen for forming each layer. The individual cells may be individually formed or may have been cut from a flexible substrate comprising multiple photovoltaic articles adjacent to each other along the length of the material. One exemplary embodiment of a photovoltaic or solar cell 20 is illustrated in FIG. 9, which includes a substantially planar and rectangular material piece having a top surface 22, an opposite bottom surface 24, a leading edge 26, and a trailing edge 28 that is generally opposite the leading edge 26. Each cell 20 may be identically or similarly sized to other cells that will be provided to the interconnect system 10, although it is understood that the individual cells may be at least slightly different from each other.

In embodiments of the invention, the top surface 22 of each cell 20 is generally configured to include a collection structure or grid comprising one or more relatively narrow conductive strips or buss lines 30, which may be approximately perpendicular to the leading and/or trailing edges 26, 28 of the material. These buss lines 30 may be adjacent to or contiguous with a plurality of collector strips or fingers 32 that extend generally parallel to the direction of the leading and/or trailing edges 26, 28. These collector strips 32 can be considerably thinner than the buss lines 30. The collector strips 32 and buss lines 30 are used together for the collection of electrons, as is known in the industry for photovoltaic processes. The collection grid can be formed from a wide range of electrically conducting materials, but most desirably are formed from one or more metals, metal alloys, or intermetallic compositions. Exemplary materials include one or more of Ag, Al, Cu, Cr, Ni, Ti, or the like, which can be used individually or in combination with each other. For one particular example, the buss lines 30 and collector strips 32 can be made of a conductive silver ink layer. In other exemplary embodiment, the collection grid has a dual layer construction including nickel and silver.

Figure 10:
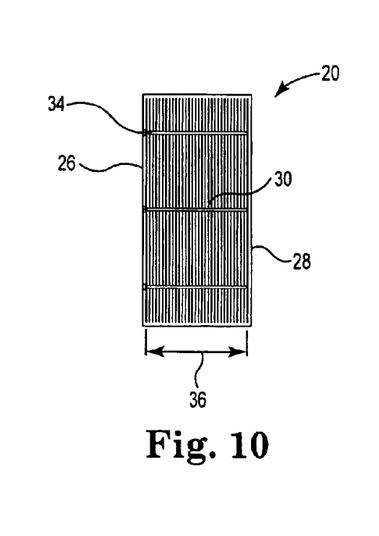
FIG. 10 is a top view of an individual solar cell of the type illustrated in FIG. 9, and further illustrating one exemplary adhesive application pattern.

FIG. 10 is another top view of the cell 20 of FIG. 9, further illustrating areas of dielectric or electrically insulating material 34 generally at the leading edge 26 of the cell 20 adjacent to the buss lines 30. The electrically insulating material 34 can be applied to one or both of the top and bottom surfaces 22, 24, and/or can be applied along the leading edge 26 of the cell 20. One exemplary pattern or dispense zone for the adhesive that will be applied in the steps described below is also illustrated in FIG. 10 and is designated as reference number 36. This illustrated adhesive dispense zone 36 extends from a point adjacent to the electrically insulating material 34 and along each buss line 30 toward the trailing edge 28, but terminates prior to reaching trailing edge 28, thereby leaving a space between the trailing edge 28 and the end of the adhesive zone 36. The adhesive is used to form an electrical connection between the top or bottom surface of a cell and an interconnect element. The adhesive is preferably an electrically conductive adhesive such as a conductive epoxy.

Figure 1:
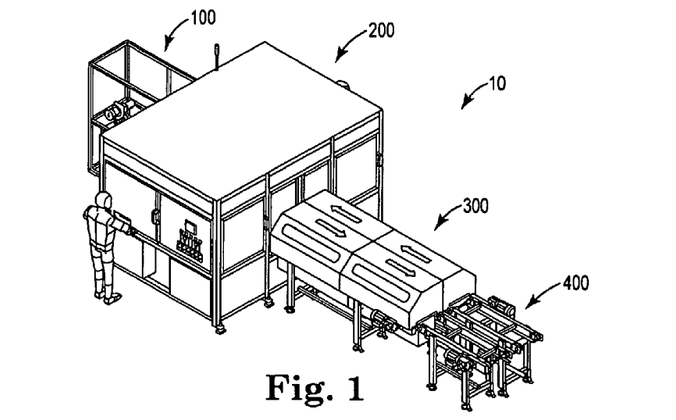
FIG. 1 is a perspective view of a solar cell interconnect system of the invention.
Figure 2:
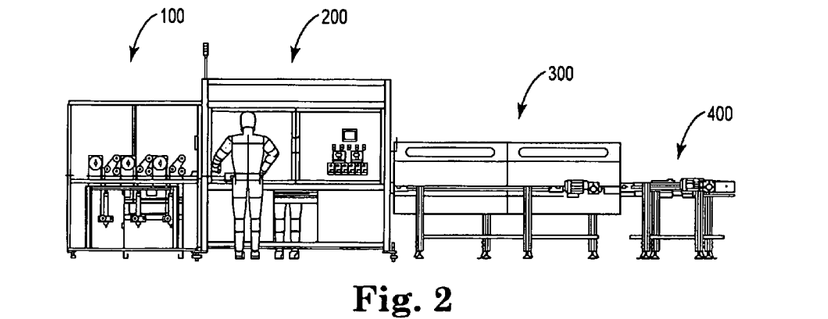
FIG. 2 is a front view of the solar cell interconnect system of FIG. 1.
Figure 3:
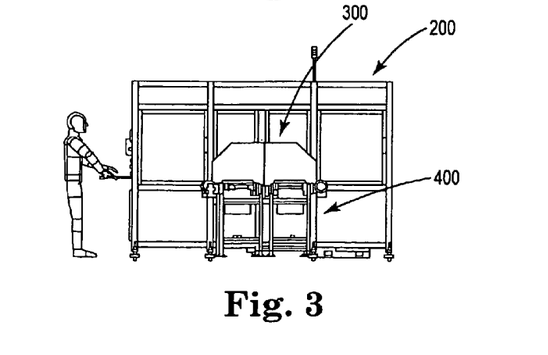
FIG. 3 is a side view of the solar cell interconnect system of FIG. 1.
Figures 4, 5, 6:
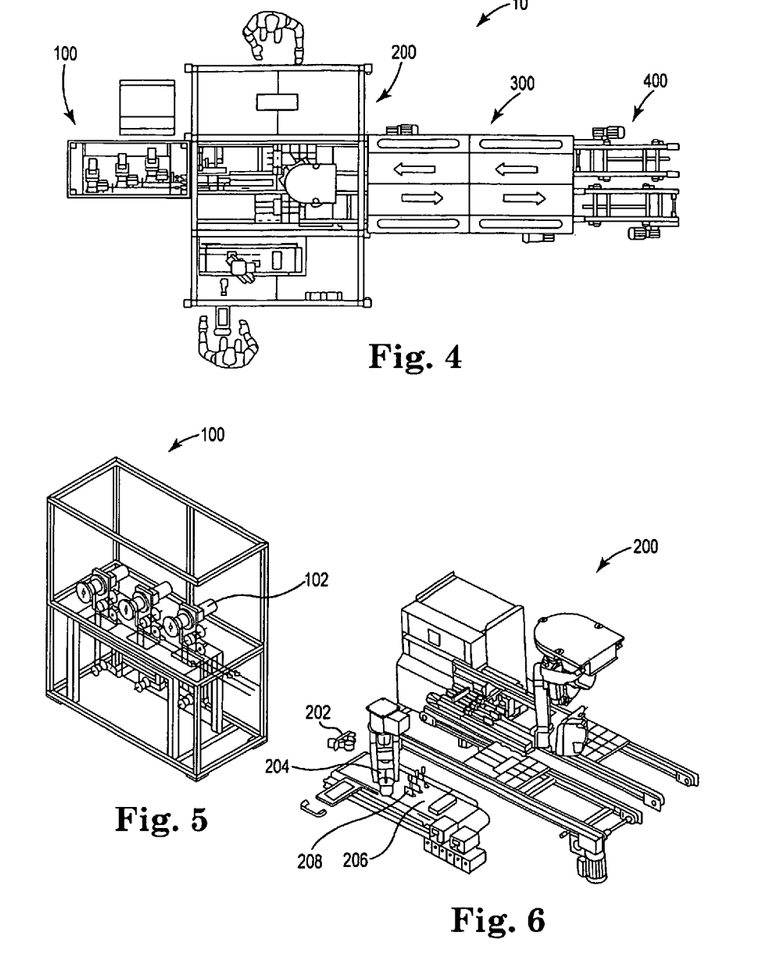
FIG. 4 is a top view of the solar cell interconnect system of FIG. 1.
FIG. 5 is a perspective view of a ribbon reel handler and unwind module of the system of FIG. 1.
FIG. 6 is a perspective view of a dispense and cell interconnect module of the system of FIG. 1.

Solar cells 20, which may be of the type illustrated in FIGS. 9 and 10, can be provided in batches or stacks and manually or automatically provided to an unloading station, which is generally part of the cell interconnect module 200 and is illustrated in FIG. 6. The solar cells 20 can be provided to the interconnect system in bins or stacks, which may include a number of solar cells that have been sorted by photovoltaic performance. The cells provided in the bins can be manually loaded individually by an operator, or an industrial robot 204 can be used to pick individual cells from the bins and place in an inspection area. A vision system 202 can then be used to guide an industrial robot 204 in the precision pick-up and placement of the photovoltaic cell onto a flattop vacuum conveyor 206 in the proper orientation. In one embodiment, the vision system 202 includes a camera that takes a picture of the top surface of the cell, which conveys information regarding the exact orientation of the cell to the robot 204 so that the robot can pick it up and placed it on the conveyor 206 in a precisely positioned orientation.

The cell can then be moved along the conveyor 206 so that adhesive can be dispensed or applied via adhesive dispensing heads 208 onto the to surface of the photovoltaic cell 20. Three of such adhesive dispensing heads 208 are illustrated, which can simultaneously apply adhesive to three separate areas, such as the adhesive dispense zones 34 described above. The adhesive dispensing heads 208 may comprise dispensing units that provide the adhesive in the form of a generally linear array of individual heads or globules. When the ribbons and pallets are placed onto the arrays of beads of adhesive, the discrete adhesive areas will spread toward other discrete areas until they connect with each other to make a continuous or relatively continuous adhesive strip. In this manner, the final width and thickness of the adhesive can be precisely controlled via adjustment of the volume and frequency of the individual beads, thereby mitigating the occurrence of excess adhesive spreading beyond the outer edges of the ribbon. The adhesive dispensing heads are jet dispensers, in one exemplary embodiment.

Figures 11, 12:
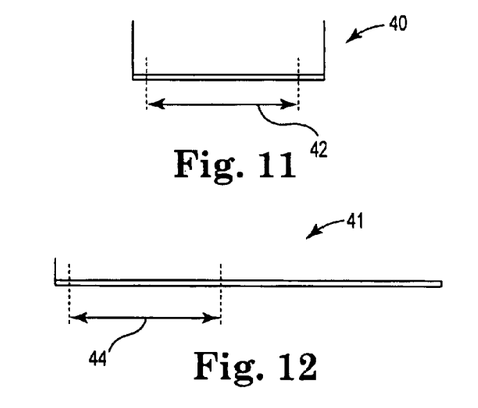
FIG. 11 is a top view of a leading ribbon and showing an exemplary adhesive dispensing zone.
FIG. 12 is a top view of an interconnect ribbon and showing an exemplary adhesive dispensing zone.
Figure 13:
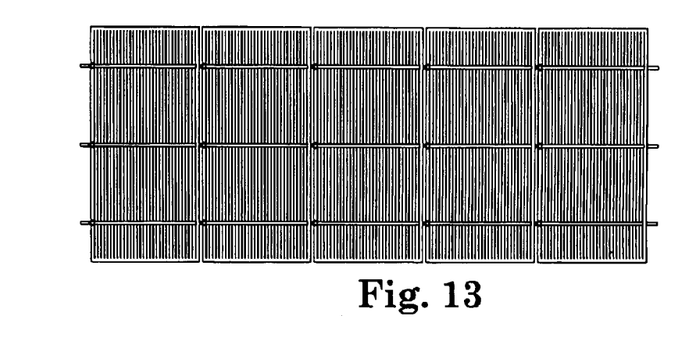
FIG. 13 is a top view of an exemplary five-cell interconnected solar cell string of the invention.

At the same time that adhesive is being applied to the top surface of the photovoltaic cell, adhesive can be applied to one side of a ribbon as that ribbon is being unwound from a spool 102 of the ribbon reel handler and unwind module 100, as is illustrated in FIG. 5. The ribbon can be a flat wire, such as a copper wire, or more preferably a tin-plated copper wire for example, although other materials may be used for the ribbon. In this configuration, three separate ribbon spools 102 are provided in order to supply the three ribbons that are needed for placement on the three adhesive dispense zones 34. In certain exemplary embodiments, ribbons of three different types and lengths are needed for producing the final interconnected assembly (e.g., interconnection ribbon, leading ribbon, or trailing ribbon, as will be described below). In the embodiments described herein, the adhesive is applied to the adhesive dispense zones 42 and 44 on the leading and interconnecting ribbons 40 and 41, respectively, as shown in FIGS. 11 and 12. Although this exemplary embodiment includes applying adhesive to the adhesive dispense zones 34 on the solar cell 20 and the adhesive dispense zones 42 and 44 on the leading and trailing ribbons 40 and 41, it is understood that adhesive can alternatively or additionally be applied to the ribbons that will be placed on those adhesive dispense zones 34, which will generally coincide with the buss lines 30 and/or applied to the bottom of cells in the predetermined locations which the leading and interconnecting ribbons will be positioned.

In another embodiment, the ribbons can be provided with a precursor that allows the ribbon to be adhered to the top and bottom surfaces of the solar cells during or after placement of the ribbons in the grooves of the pallets. As an example, ribbons coated with a pressure sensitive adhesive may be used that form a bond with the surfaces of the cells when pressure is applied, for example when the top pallets are placed on the cell. In another embodiment, the ribbons may comprise a solder coating that allows bonding of the ribbon to the top and bottom surfaces of the cells via the application of heat.

Figure 16:
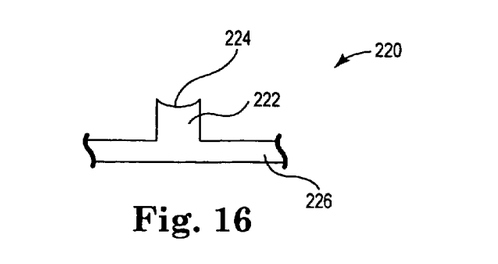
FIG. 16 is a side view of an exemplary vacuum system for use in providing straight wire material to the adhesive dispensing stations.

The ribbon unwinding operation can further include cutting the ribbon into certain predetermined lengths, depending on the intended use for that ribbon in an interconnected solar cell assembly (e.g., interconnection ribbon, leading ribbon, or trailing ribbon, as will be described below). The cutting operation can take place either in the ribbon reel handler and unwind module 100, or in the cell interconnect module 200. In order to provide ribbon in a generally flat and straight configuration for attachment to their respective solar cells, the interconnect module 200 can be provided with a vacuum fixture, such as fixture 220 illustrated in FIG. 16. In this embodiment, the fixture 220 includes a plate 226 having a protrusion 222 with a distal groove 224 and a plurality of vacuum holes (not shown), which can help to ensure that the ribbon is secured in a precise orientation as it is unwound from the spool and moves across the groove 224. The ribbon reel handler and unwind module 100 also comprises mechanisms for removing camber from the ribbons as they are introduced into the interconnect system 200. This ensures that the final interconnected assembly can be manufactured within the specified tolerances.

In exemplary embodiments, the ribbon straightening mechanism comprises a plurality of rollers through which the ribbons are fed prior to cutting to reduce the camber of the ribbon material. In one embodiment, the ribbon straightening mechanism comprises an electric motor-driven spool unwind that is actuated by positioning feedback that is provided by a moving "dancer" roller placed onto an unspooled section of the ribbon. This dancer roller can provide tension to the ribbon material as it moves through the mechanism. After the ribbon passes under or past the dancer roller, various roller-type material straightening mechanisms can be used to correctly position the ribbon as it comes out of the unwind module 100.

Figure 15:
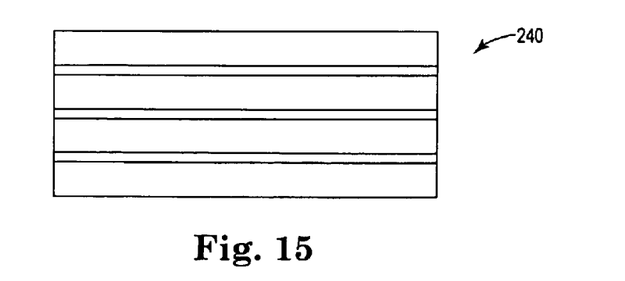
FIG. 15 is a top view of a bottom pallet, in accordance with the invention.

In accordance with the invention, precision servo and pneumatic controlled actuators can be used in conjunction with a robot to interconnect multiple solar cells into a string using a relatively large bottom pallet with multiple top pallets. In particular, a bottom pallet 240 is illustrated in FIG. 15, which can be sized to accommodate an entire string of interconnected solar cells during the interconnection process. The width of the grooves in the bottom pallet are approximately equal to the width of the ribbons and provide a mechanism for ensuring that the multiple ribbons across the width of the cells are parallel within 0.1 mm tolerance. The pallets can further provide mechanical engagement and alignment features that assist in accurate assembly of the pallets and that also assist in maintaining accuracy of the pallet alignment during conveyance of the assembly through subsequent processing steps (e.g., oven curing). The depth of the grooves is configured to be approximately equal to the thickness of the ribbon, plus the desired final thickness of the adhesive. In certain embodiments, the bottom pallet further comprises notches in the edge of the pallet that enable clamping of the pallet for holding it in position during fabrication of the interconnected assembly. The bottom pallet may also consist of a plurality of holes for application of vacuum to secure the cells in place during assembly of the interconnected string, or can alternatively or additionally include other features for securing the cells in place.

One upper pallet is typically provided for each of the individual cells, wherein the width of each upper pallet is approximately equal to the width of the individual solar cells. For example, for a five-cell solar cell assembly, one lower pallet is provided and five upper pallets are provided. The top pallets comprise a top plate with an extension that comprises a groove. The groove can be configured with a plurality of holes for application of vacuum for securing ribbons during ribbon transfer, or can alternatively or additionally include other features for securing the ribbons in a designated location, such as clamps, magnets, and the like. The width of each of the grooves in the top pallet is approximately equal to the width of each of the ribbons. After the initial assembly of the cells, ribbons and pallets, the interconnecting ribbons can be present in the grooves of both the bottom pallet and the top pallet, thereby providing a mechanism for ensuring that the multiple ribbons across the width of the cells are parallel within a specified tolerance (e.g., 0.1 mm tolerance). The depth of the grooves is configured to be approximately equal to the thickness of the ribbon, plus the desired final thickness of the adhesive.

Figure 14:
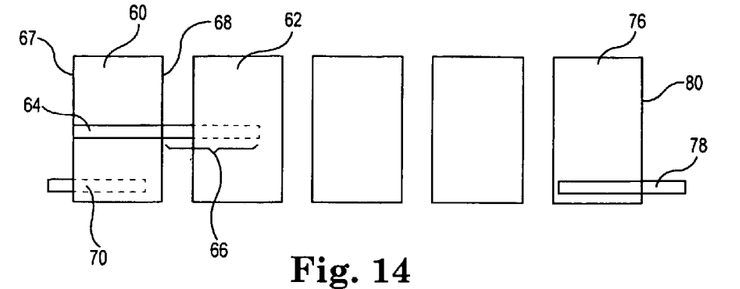
FIG. 14 is a schematic illustration of five solar cells shown without a collection grid pattern and with only a single interconnection ribbon, trailing ribbon, and leading ribbon shown, for clarity of illustration.

FIG. 14 schematically illustrates various ribbons that can be used with solar cells in constructing a solar cell string including five solar cells. In order to configure the pallets for interconnecting a first solar cell 60 and a second solar cell 62, a first interconnect ribbon 64 is positioned in a groove of a top pallet so that it is facing the top surface of the solar cell 60. Adhesive is applied to either the top surface of the first cell (e.g., along one of the buss lines), along a portion of a surface of the ribbon 64, or on both of these surfaces. The ribbon and top surface of the cell are brought into contact with each other, with a portion 66 of the ribbon 64 extending beyond a trailing edge 68 of the cell 60. The portion 66 is positioned in a groove of a bottom pallet so that it is facing a bottom surface of the second solar cell 62. Adhesive is applied to either the bottom surface of the second cell, along a portion 66 of the ribbon 64, or on both of these surfaces. The ribbon portion 66 and the second cell 62 are then brought in contact with each other to adhere the ribbon to the bottom of the second solar cell 62. This process can be simultaneously performed with three ribbons, for example, as would be needed to interconnect the cells along three buss lines of adjacent solar cells. In addition, the process of interconnecting two adjacent solar cells can be repeated also for attaching the other adjacent cells to each other (e.g., attaching the second and third solar cells, the third and fourth cells, etc.).

In many embodiments of a solar cell array, one end of the array includes a trailing ribbon and another end of the array includes a leading ribbon. These ribbons are provide for electrical connection of the module or string with other equipment in order to utilize the solar power collected by the solar cell array. In order to attach a leading ribbon 70 to the solar cell array of FIG. 14, the leading ribbon 70 is positioned in a groove of a bottom pallet and facing the bottom surface of the first cell 60. Adhesive is applied to either the bottom surface of the first cell, along a portion of the leading ribbon 70, or on both of these surfaces. The leading ribbon and the bottom surface of the first solar cell 60 are then brought into contact with each other to adhere the leading ribbon 70 to the solar cell 60. A portion of the ribbon 70 is positioned to extend beyond a leading edge 67 of the solar cell 60. Similarly, in order to attach a trailing ribbon 78 to a final solar cell 76 of a string, the trailing ribbon 78 is positioned in a groove of a top pallet and facing a top surface of the cell 76. Adhesive is applied to either the top surface of the cell 76, along a portion of the trailing ribbon 78, or on both of these surfaces. The trailing ribbon 78 and the top surface of the cell 76 are then brought into contact with each other to adhere the trailing ribbon 78 to the cell 76. A portion of the ribbon 78 is positioned to extend beyond a trailing edge 80 of the cell 76.

Figure 7:
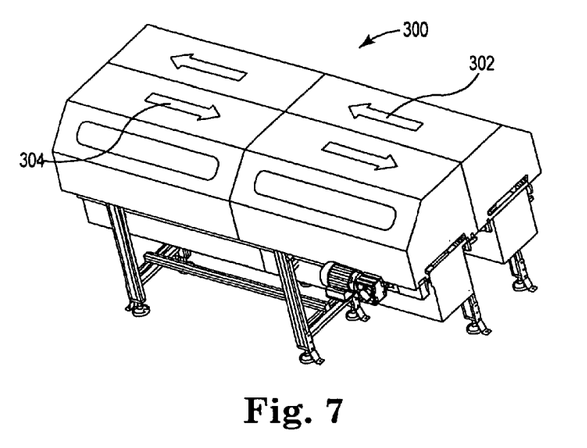
FIG. 7 is a perspective view of a curing oven module of the system of FIG. 1.

After the interconnection process is complete, the entire interconnected string and their corresponding top and bottom pallets are transported through an oven, such as an infrared curing oven module 300 illustrated in FIG. 7, in order to cure the adhesive. The oven may be provided with a series of infrared lamps, for example, which can have same or different intensities in the different zones. For one example, it may be desirable for the interconnected string to be initially subjected to low intensity curing that can be ramped up to a higher level at the end of the curing process. For another example, it may be desirable for the interconnected string to be initially subjected to relatively high intensity curing that can be ramped down to a higher level at the end of the curing process. That is, the oven zones can be designed to provide the optimum curing conditions for the particular adhesive that is used and it is contemplated that the intensity is variable so that it can be adjusted for different adhesives and or substrates onto which the adhesives are applied. In one exemplary embodiment, the curing temperature of the adhesive is monitored and controlled using feedback from temperature sensors that measure the temperature of the pallets via reflected infrared energy.

As shown with the arrows 302, 304, in an exemplary embodiment, the pallet system with interconnected solar cells will move in a first direction 302 through the oven until it reaches one end, and then a transfer conveyor or interconnect conveyor system 400 of FIG. 8 will move the pallet system to the other side of the oven so that it can travel in an opposite direction 304 and back toward the cell interconnect module 200. The conveyor system 400 includes a first conveyor section 410 and a second conveyor section 420. The conveyor system 400 is a transfer conveyor that is utilized to send the pallets back through the oven. While in this embodiment, the conveyor system 400 is external to the oven because some components are not resistant to the oven temps, it is contemplated that the components are instead heat-resistant so that the conveyor can be positioned entirely or partially inside the oven.

According to this exemplary path that the pallets follow, after the pallets leave the oven, they are transported back to the interconnect module 200 for their reuse in assembling another solar cell string. Alternatively, the interconnect system could comprise of a second interconnect module 200 at the end of the oven module 300, or an offload module at the end of the oven module 300. In particular, once the pallet system with a solar cell string arrives back at the interconnect module 200, an industrial robot of the interconnect module 200 can remove the top pallets and position them for use in another interconnect assembly operation. A robot is also used to offload the complete and cured solar cell string from a bottom pallet, which is heated and thermally stabilized, to an operator offload station. The solar cell string can then be stacked or otherwise stored for transport to another location, such as for incorporation of the solar cell strings into a solar roof panel, for example. However, it is possible that the system is configured such that the strings move through the oven in only one direction. In this case, the oven will have a longer footprint and means would need to be provided for transporting the pallets back to the cell interconnect module 200 for use in subsequent operations.

The interconnect system may also be configured with a system for attachment of additional electrically conductive elements to the ends of the leading and trailing ribbons. The conductive elements may include buss bars or terminal bars and other conductive elements that may be required to connect the interconnected solar cell assembly to external circuitry. In an exemplary embodiment, the leading ribbons are connected to a first terminal bar, while the trailing ribbons are attached to a second terminal bar at the opposite end of the interconnected solar cell assembly. In a further exemplary embodiment, the first terminal bar and second terminal bar are electrically connected to each other. Possible methods of attachment of the leading and trailing ribbons to other conductive elements such as terminal bars may include soldering and welding. In an exemplary embodiment, the connection process is carried out via laser welding. In a further exemplary embodiment, the attachment of conductive elements can occur while the pallets are still in place with the interconnected assembly, such as following the completion of the interconnected string or following the curing process, while the cells and ribbons are secured in place by the pallet assemblies. This enables the final interconnected assembly including terminal bars to be manufactured within specified tolerances.

The present invention has now been described with reference to at least one embodiment thereof. The contents of any patents or patent application cited herein are incorporated by reference in their entireties. The foregoing detailed description and examples have been given for clarity of understanding only. No unnecessary limitations are to be understood therefrom. It will be apparent to those skilled in the art that many changes can be made in the embodiments described without departing from the scope of the invention. Thus, the scope of the present invention should not be limited to the structures described herein, but only by the structures described by the language of the claims and the equivalents of those structures.

The invention claimed is:

1. A method of manufacturing electrically interconnected solar cell assemblies, comprising the steps of:
    (a) providing a first photovoltaic cell;
    (b) positioning at least a first interconnect element in an alignment feature of a top carrier and facing a top surface of the first cell;
    (c) adhering the first interconnect element to a predetermined location on the top surface of the first cell, wherein a length of the first interconnect element extends beyond a trailing edge of the first cell;
    (d) prior to step (e), positioning a portion of the length of the first interconnect element that extends beyond the trailing edge of the first cell in a first alignment feature of a bottom carrier;
    (e) adhering a portion of the length of the first interconnect element that extends beyond a trailing edge of the first cell to a bottom surface of a second cell and adhering at least a portion of the length of the first interconnect element that is positioned in the first alignment feature of the bottom carrier to a predetermined location on the bottom surface of the second cell;
    (f) positioning at least one subsequent interconnect element in an alignment feature of a top carrier and facing a top surface of a last cell in a string of cells to which an interconnect element has been attached on its bottom surface;
    (g) adhering the at least one subsequent interconnect element to a predetermined location on the top surface of the last cell in the string to which an interconnect element has been attached on its bottom surface, wherein a length of the at least one subsequent interconnect element extends beyond a trailing edge of the last cell in the string of cells to which an interconnect element has been attached on its bottom surface;
    (h) positioning a portion of the length of the at least one subsequent interconnect element that extends beyond a trailing edge of the last cell in the string of cells to which an interconnect element has been attached on its bottom surface in a first alignment feature of a bottom carrier; and
    (i) adhering at least a portion of the length of the at least one subsequent interconnect element that is positioned in the first alignment feature of the bottom carrier to a predetermined location on the bottom surface of a cell that is located adjacent to the cell in the string that is attached to the last cell in the string of cells to which an interconnect element has been attached on its bottom surface, wherein the string of cells comprises the first cell and a final cell that is spaced furthest in the string from the first cell.

2. The method according to claim 1, wherein step (c) further comprises applying adhesive on at least one of a predetermined location on the top surface of the first cell and a predetermined location on a surface of the first interconnect element.

3. The method according to claim 1, wherein step (e) further comprises applying adhesive on at least one of a predetermined location on a bottom surface of the second cell and a portion of the length of the first interconnect element that is positioned in the first alignment feature of the bottom carrier.

4. The method according to claim 1, further comprising the following steps:
    (j) positioning at least one trailing element in an alignment feature of a top carrier and facing a top surface of the final cell of the string; and
    (k) adhering the at least one trailing element to a predetermined location on the top surface of the final cell, wherein a portion of each of the at least one trailing elements extends beyond a trailing edge of the final cell.

5. The method according to claim 4, further comprising the following steps:
    (l) positioning at least one leading element in an alignment feature of a bottom carrier and facing a bottom surface of the first cell;
    (m) adhering the at least one leading element to a predetermined location on the bottom surface of the first cell, wherein a portion of each of the at least one leading elements extends beyond a leading edge of the first cell.

6. The method according to claim 1, wherein the top and bottom carriers each comprise multiple alignment features, and wherein the method further comprises simultaneously performing steps (a) through (i) for multiple interconnect elements spaced from each other across a width of the first and second cells.

7. The method according to claim 4 wherein the top carrier comprises multiple alignment features, and wherein the method further comprises simultaneously performing steps (j) through (k) for multiple trailing elements spaced from each other across a width of the final cell and/or simultaneously performing steps (l) through (m) for multiple leading elements spaced from each other across a width of the first cell.

8. The method according to claim 1, wherein each photovoltaic cell comprises at least one electrically insulating region located at a predetermined location proximal to its trailing edge.

9. The method according claim 1, wherein each photovoltaic cell comprises a collection structure that comprises as least one buss line arranged to be generally perpendicular to at least one of the leading and trailing edges of each photovoltaic cell and/or a plurality of fingers arranged generally perpendicular to the at least one buss line.

10. The method according to claim 5, wherein adhering comprises applying an electrically conductive adhesive to predetermined locations on each of the photovoltaic cells and the interconnecting and leading elements.

11. The method according to claim 10, wherein the adhesive is applied by at least one of applying an array of individual beads and/or applying adhesive using a jet dispensing process.

12. The method according to claim 1, wherein at least one of the alignment features comprises a groove in at least one of the top and bottom carriers.

13. The method according to claim 1, wherein at least one of the carriers is a pallet.

14. The method according to claim 12, wherein the depth of each groove is approximately equal to a thickness of the portion of each interconnect element that will be positioned in the groove plus a desired final thickness of the adhesive applied on each element.

15. The method according to claim 1, wherein each carrier comprises a holding element to keep the interconnect elements in a designated location defined by one of the alignment features.

16. The method according to claim 1, further comprising using a multi-axis robot for positioning a top carrier having a portion of any of the interconnect elements relative to the top surface of any of the cells.

17. The method according to claim 2, further comprising the step of curing the adhesive after it is applied to at least one of the surfaces of at least one of the cells by transporting the electrically interconnected solar cells and the top and bottom carriers through a curing oven.

* * * * *